(12) United States Patent
Guo

(10) Patent No.: US 12,051,608 B2
(45) Date of Patent: Jul. 30, 2024

(54) METHOD FOR ADJUSTING WAFER DEFORMATION AND SEMICONDUCTOR STRUCTURE

(71) Applicant: CHANGXIN MEMORY TECHNOLOGIES, INC., Hefei (CN)

(72) Inventor: Shuai Guo, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 409 days.

(21) Appl. No.: 17/520,791

(22) Filed: Nov. 8, 2021

(65) Prior Publication Data

US 2023/0025264 A1 Jan. 26, 2023

Related U.S. Application Data

(63) Continuation of application No. PCT/CN2021/110026, filed on Aug. 2, 2021.

(30) Foreign Application Priority Data

Jul. 20, 2021 (CN) ........................ 202110819709.4

(51) Int. Cl.
*H01L 21/67* (2006.01)
*H01L 21/308* (2006.01)
*H01L 21/477* (2006.01)

(52) U.S. Cl.
CPC .... *H01L 21/67288* (2013.01); *H01L 21/3086* (2013.01); *H01L 21/477* (2013.01)

(58) Field of Classification Search
CPC ........... H01L 21/67288; H01L 21/3086; H01L 21/477; H01L 21/302
See application file for complete search history.

(56) References Cited

U.S. PATENT DOCUMENTS

| | | | |
|---|---|---|---|
| 7,022,587 B2 | 4/2006 | Koennemann | |
| 2004/0152285 A1 | 8/2004 | Konnemann | |
| 2018/0342410 A1* | 11/2018 | Hooge | H01L 21/302 |
| 2020/0098601 A1* | 3/2020 | Ueno | H01L 21/67288 |
| 2021/0358786 A1* | 11/2021 | Yu | H01L 23/49513 |
| 2022/0293413 A1* | 9/2022 | Chang | H01L 21/3086 |
| 2023/0238257 A1* | 7/2023 | Kanazawa | H01L 21/67288 |
| | | | 438/14 |

FOREIGN PATENT DOCUMENTS

| | | | | |
|---|---|---|---|---|
| CN | 102479683 B | 8/2016 | | |
| CN | 106252288 A | 12/2016 | | |
| CN | 108376652 A | 8/2018 | | |
| CN | 108649021 A | * 10/2018 | ............ | H01L 21/56 |
| CN | 108649021 A | 10/2018 | | |
| CN | 208433397 U | 1/2019 | | |
| JP | 2005228806 A | 8/2005 | | |

* cited by examiner

Primary Examiner — S M Sohel Imtiaz
(74) Attorney, Agent, or Firm — Kilpatrick Townsend & Stockton LLP

(57) ABSTRACT

A method for adjusting wafer deformation and a semiconductor structure are provided. The method includes the following operations. A deformation position and a deformation degree of a wafer are determined. At least one groove is formed at a back of the wafer according to the deformation position and the deformation degree. A stress film having a stress effect on the wafer deformation is formed at the back of the wafer with the at least one groove, and the stress film covers an inner wall of the at least one groove.

17 Claims, 11 Drawing Sheets

Form grooves

STO deposition

METHOD FOR ADJUSTING WAFER DEFORMATION AND SEMICONDUCTOR STRUCTURE

CROSS-REFERENCE TO RELATED APPLICATION

This application is a US continuation application of International Application No. PCT/CN2021/110026, filed on Aug. 2, 2021, which is based upon and claims priority to Chinese Patent Application No. 202110819709.4, filed on Jul. 20, 2021 and entitled "METHOD FOR ADJUSTING WAFER DEFORMATION AND SEMICONDUCTOR STRUCTURE". The disclosures of International Application No. PCT/CN2021/110026 and Chinese Patent Application No. 202110819709.4 are hereby incorporated by reference in their entireties.

BACKGROUND

The wafer is a monocrystalline silicon material which is used for manufacturing a semiconductor device and the wafer is silicon wafer formed by performing grinding, polishing, sliding and other steps on the cylindrical monocrystalline silicon. The wafer is a raw material and a substrate for manufacturing various semiconductor products. In a process of manufacturing the semiconductor products, a complicated device and a circuit structure may be formed by performing various means, including photolithography, ion implantation, coating and cleaning on a surface of the wafer.

SUMMARY

Embodiments of the present disclosure relate, but are not limited, to a method for adjusting wafer deformation and a semiconductor structure.

Embodiments of the present disclosure provide a method for adjusting wafer deformation and a semiconductor structure.

According to a first aspect, embodiments of the present disclosure provide a method for adjusting wafer deformation. The method includes the following operations.

A deformation position and a deformation degree of a wafer are determined.

At least one groove is formed at a back of the wafer according to the deformation position and the deformation degree.

A stress film having a stress effect on the wafer deformation is formed at a back of the wafer with the at least one groove. The stress film covers an inner wall of at least one groove.

According to a second aspect, embodiments of the present disclosure provide a semiconductor structure. The semiconductor structure includes a wafer, at least one groove and a stress film.

The at least one groove is provided at a back of the wafer.

A back of the wafer with at least one groove includes the stress film having a stress effect on the wafer deformation. The stress film covers an inner wall of the at least one groove and is used to adjust the wafer deformation.

BRIEF DESCRIPTION OF THE DRAWINGS

One or more embodiments are illustrated by pictures in the drawings corresponding to them. Unless otherwise stated, the pictures in the drawings do not constitute a proportional restriction.

DETAILED DESCRIPTION

In order to facilitate the understanding of the present disclosure, the present disclosure will be described more comprehensively below with reference to the relevant drawings. The drawings show preferred embodiments of the present disclosure. However, the present disclosure may be implemented in various forms and is not limited to the embodiments described herein. Instead, these embodiments are provided to make the contents disclosed in the present disclosure more thoroughly and comprehensive.

Unless otherwise defined, all technical and scientific terms used herein have the same meanings as commonly understood by those skilled in the art that the present disclosure belongs to. Herein, terms used in the description of the present disclosure are only for the purpose of describing specific embodiments and not intended to limit the present disclosure. Term "and/or" used herein includes one or any and all combinations of multiple related items which are listed.

As used herein, singular forms "a/an", "one", and "the" may include the plural forms, unless otherwise specified types in the context. It is also to be understood that, terms such as "comprising/containing" or "having" appoint existence of declarative features, wholes, steps, operations, components, parts or combinations of them, but not excluding the possibility of existence or adding of one or more other features, wholes, steps, operations, components, parts or combinations of them.

It is found that stress generated during these manufacturing processes may result in wafer deformation, thereby causing product failure, low yield and other problems.

Figure 1:
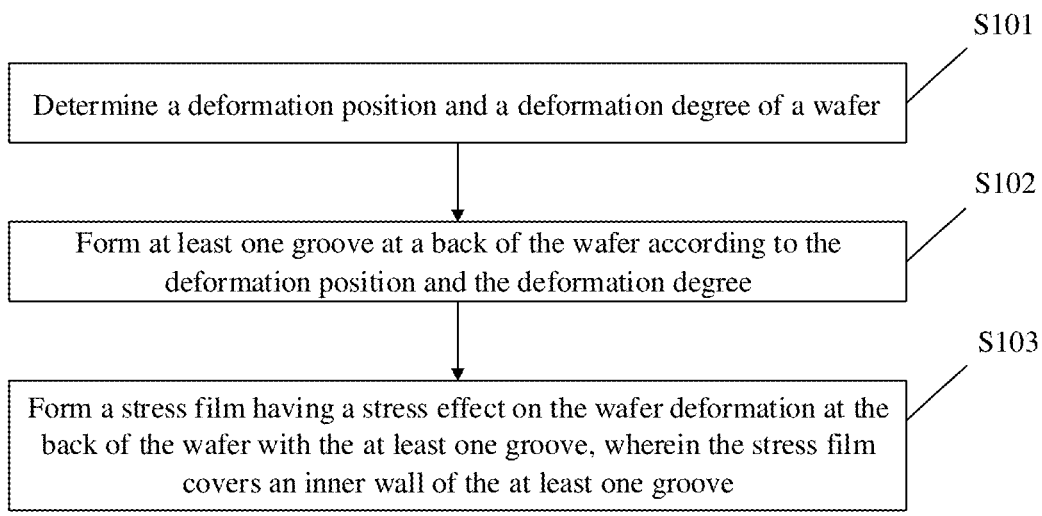
FIG. 1 is a flowchart of a method for adjusting wafer deformation according to embodiments of the present disclosure.

Embodiments of the present disclosure provide a method for adjusting wafer deformation. As shown in FIG. 1, the method includes the following operations.

At step S101, a deformation position and a deformation degree of a wafer are determined.

At step S102, at least one groove is formed at the back of the wafer according to the deformation position and the deformation degree.

At step S103, a stress film having a stress effect on the wafer deformation is formed at the back of the wafer with the at least one groove, and the stress film covers an inner wall of the at least one groove.

In a process of manufacturing the semiconductor products, a complicated device and a circuit structure may be formed by performing various means, including photolithography, ion implantation, coating and cleaning on a surface of the wafer. Stress generated during these manufacturing processes may result in wafer deformation, which is also called as wafer warpage. If control is not performed, the wafer deformation may result in a position deviation of a subsequent process, thereby affecting a manufacturing precision and causing a product failure.

Figure 2:
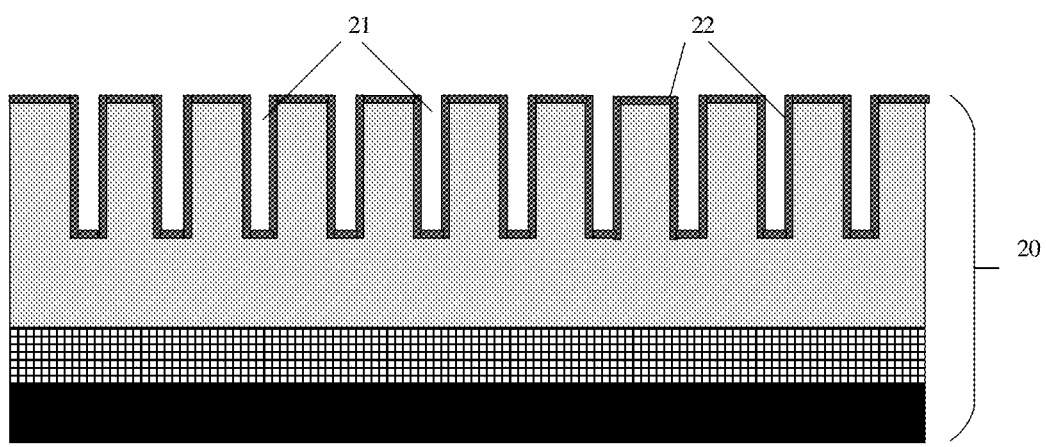
FIG. 2 is a schematic diagram of forming a groove and a stress film in a method for adjusting wafer deformation according to embodiments of the present disclosure.

Therefore, in embodiments of the present disclosure, as shown in FIG. 2, the deformation of the wafer 20 may be adjusted by forming the groove 21 at the back of the wafer. The groove herein may be a groove in a narrow slit form, or a circular hole or other shapes of groove. The shape and the depth of the groove may be determined according to the abovementioned deformation degree. The stress effect may be generated at a deformation position of the wafer through the groove, and then the wafer deformation may be adjusted.

In addition, considering the limited direction and intensity of the stress effect generated by the groove, the wafer deformation may be irregular, so the embodiments of the present disclosure may further adjust the stress of the wafer 20 in a manner that the stress film 22 is formed on the surface of the groove 21.

It should be noted that the abovementioned processes of forming the groove and forming the stress film may be performed in any period of the manufacturing process of the semiconductor products. For example, the measurement for the wafer deformation is performed when the wafer deformation is generated, which makes it impossible to perform position alignment in some processes or is easy to generate large deviation, or the measurement of wafer deformation is performed after some process production processes where the wafer is easy to deform. The wafer is further turned, and the deformation is adjusted in a manner that the abovementioned method is performed at the back of the wafer.

Thus, the wafer deformation may be adjusted in the manufacturing process of the semiconductor products, and the adjustment method is simple and easy to implement and not easy to disturb the manufacturing of the semiconductor products, so that the product performance and production yield may be effectively improved.

In some embodiments, the material of the abovementioned stress film may be a material with a thermal expansion coefficient greater than that of the wafer. Thus, the stress may be adjusted through the thermal expansion of the stress film, and then the deformation of the wafer may be improved.

Exemplarity, the material of the stress film may be STO, namely, Strontium Titanium Oxide of which the chemical formula is SrTiO3, or a doped STO material. STO is an electroceramics material used widely, which has higher thermal expansion coefficient, high thermal stability, high dielectric constant and low price.

In some embodiments, the material of the stress film is a crystalline material, and the operation that the stress film having the stress effect on the wafer deformation is formed at the back of the wafer with at least one groove includes the following operations.

The material of the stress film is deposited at the back of the wafer with at least one groove.

Annealing treatment is performed on the material of the stress film, and the stress film is formed through crystallizing.

The abovementioned stress film is the crystalline material. That is, a crystalline film may be formed on the surface of the groove at the back of the wafer. In embodiments of the present disclosure, the material of the stress film may be firstly deposited to form a liquid or solid film, and then a crystallized stress film is formed through annealing. In a crystallizing process of the stress film, lattice change will occur, and then the stress adjustment is implemented.

In some embodiments, the operation that the material of the stress film is subjected to annealing treatment and the stress film is formed through crystallizing includes the following operation.

The annealing treatment with a corresponding temperature is performed on the material of the stress film according to the deformation degree, and the stress film is formed through crystallizing.

A temperature in an annealing process may affect the stress intensity of the stress film, so different temperatures may be adopted for annealing treatment according to the deformation degree in a process that the material of the stress film is subjected to the annealing treatment. For example, the greater the deformation, the higher the annealing temperature, and the smaller the deformation, the lower the annealing temperature. For another example, the deformation size change may be monitored in real time in the annealing process, and the annealing temperature is adjusted accordingly.

In some embodiments, a plurality of deformation positions are provided at the back of the wafer, and the operation that the annealing treatment with the corresponding temperature is performed on the material of the stress film according to the deformation degree and the stress film is formed through crystallizing includes the following operation.

The annealing treatment with different temperatures is performed on the material of the stress film covered at different deformation positions according to the deformation degrees at different deformation positions, and the stress film is formed through crystallizing.

Considering that different degrees of deformation may exist at different positions of the wafer, so the different deformation positions at the back of the wafer may be respectively adjusted based on the deformation degree.

In the abovementioned process of forming the stress film, different annealing temperatures may generate different magnitudes of stress, so the annealing treatment with different temperatures may be performed on deformation positions according to the deformation degrees of different deformation positions, thereby flexibly adjust the wafer deformation.

In some embodiments, the operation that the annealing treatment with the corresponding temperature is performed on the material of the stress film according to the deformation degree and the stress film is formed through crystallizing includes the following operations.

Figure 3:
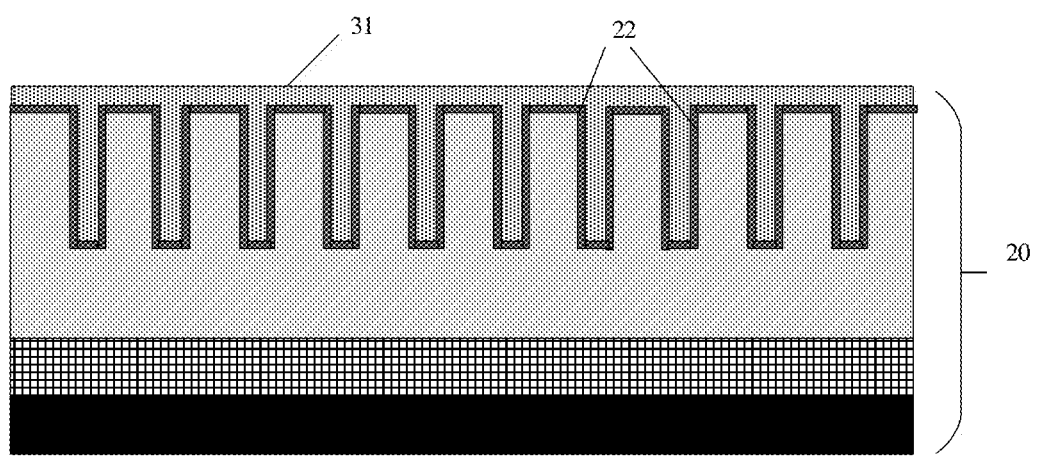
FIG. 3 is a schematic diagram of filling a groove in a method for adjusting wafer deformation according to embodiments of the present disclosure.

An amorphous silicon film 31 is deposited at the back of the wafer 20 covered with the material of the stress film 22 as shown in FIG. 3, and at least one groove is filled.

The annealing treatment with the corresponding temperature is performed on the back of the wafer according to the deformation degree, and the stress film is formed through crystallizing.

In embodiments of the present disclosure, the material of the stress film covering the back of the wafer after forming the groove is a layer of film with smaller thickness, which may be only covered on an inner wall of the groove instead of filing the whole groove. When the annealing treatment is performed on the stress film, a layer of amorphous silicon may be firstly covered on the surface of the material of the stress film, so that the amorphous silicon fills the groove and covers the back of the wafer, and the back of the wafer presents a smooth plane.

When performing the annealing treatment on the amorphous silicon film, the amorphous silicon may be crystallized to form polycrystalline silicon, and meanwhile the material of the stress film covered by the amorphous silicon film is also crystallized to form the above stress film. Stress adjustment is implemented in a crystallizing process, and the wafer deformation is improved.

In some embodiments, the operation that at least one groove is formed at the back of the wafer according to the deformation position and the deformation degree includes the following operations.

An adjusting area for forming at least one groove is determined at the back of the wafer according to the deformation position.

At least one groove, each having a respective depth, is formed in the adjusting area according to the deformation degree.

In embodiments of the present disclosure, various positions, where the wafer deformation occurs, may be firstly detected, and the adjusting area is determined in the positions, where the deformation occurs. The scope of the adjusting area may cover the whole deformation position, or an area corresponding to the deformation position may be determined according to the stress effect, and then the above groove is formed in each adjusting area.

Due to different deformation degrees in different areas, the grooves with different depths, widths or lengths may be formed in different adjusting areas, thereby implementing flexible adjustment.

In some embodiments, the operation that at least one groove, each having a respective depth is formed in the adjusting area according to the deformation degree includes the following operation.

The at least one groove, each having the respective depth, is formed in the adjusting area by etching according to the deformation degree.

In embodiments of the present disclosure, the method for forming the groove at the back of the wafer may be formed by etching, including dry etching, wet etching, etc. The part of silicon at the back of the wafer is peeled from the wafer through a corrosive solution, a reactive ion or other gas, so as to form the groove.

In some embodiments, the operation that at least one groove, each having the respective depth, is formed in the adjusting area according to the deformation degree includes the following operations.

A mask layer with an etching pattern is formed on a surface of the adjusting area.

According to the deformation degree, the at least one groove, each having the respective depth, is formed in the adjusting area by etching a position unmasked by the mask layer.

The mask layer is removed.

The groove is formed through an etching method, an area that is not required to be etched may be masked by using the mask layer, and an area that is required to form the groove is exposed. The mask layer may be a film with silicon nitride or silicon oxide or other materials. An patterned area is formed through photolithography and other processes, and then etching is performed to form the groove, finally the mask layer may be further removed through grinding or etching manner, and the groove is finally formed at the back of the wafer.

In some embodiments, a semiconductor device is formed at the front of the wafer and in a first thickness from the front of the wafer to the interior of the wafer, and a depth of at least one groove is less than a difference between the thickness of the wafer and the first thickness.

In embodiments of the present disclosure, the back of the wafer is used to form the groove and the stress film to adjust the wafer deformation, and the front of the wafer is used to manufacture the semiconductor device. The ion implantation, etching and other processes are needed to perform on the surface of the wafer to form semiconductor device. That is, the area in a certain thickness (the above first thickness) from the front of the wafer to the interior of the wafer is used to form the semiconductor device. Therefore, the groove formed at the back of the wafer cannot affect the area required by the semiconductor device. That is, a bottom of the groove does not exceed bottom of the wafer thickness occupied by the semiconductor device. So, the depth of the first groove needs to be less than the difference between the wafer thickness and the above first thickness.

In some embodiments, the grooves include at least two grooves with different shapes, depths or widths.

The deformation degree of the wafer in different areas may have a difference, so different grooves may be used for adjusting the different deformation degrees at different positions. That is, the shape, depth or width of each groove may be different. Certainly, considering that adjustment may be further performed through the stress film, the shape, depth or width of each above groove may be same.

Thus, the wafer deformation may be flexibly adjusted from a plurality of dimensions, so as to reduce a semiconductor device failure condition caused by the wafer deformation, and improve the product yield.

In some embodiments, before forming at least one groove at the back of the wafer, the method further includes the following operations.

A protective film is formed on a surface of the semiconductor device at the front of the wafer.

The wafer is turned, so that the orientation of the back of the wafer is vertically upward.

When forming the groove at the back of the wafer, the wafer needs to be turned and the back of the wafer is toward upwards, and then etching and other processes are needed to perform on the wafer. However, the front of the wafer may have been subjected to a section of process related to the semiconductor device, and a part of or all of semiconductor device is formed. In order to protect the semiconductor device at the front of the wafer from being damaged and facilitate turning and fixing the wafer while the groove is formed at the back of the wafer, the protective film may be firstly formed on the surface of the semiconductor device at the front the wafer. The protective film may be made of polycrystalline carbon, polycrystalline silicon, oxide, or silicon nitride, etc.

In some embodiments, after forming the stress film at the back of the wafer, the method further includes the following operations.

The wafer is turned, so that the orientation of the front of the wafer is vertically upward.

The protective film at the front of the wafer is removed.

After the groove and the stress film at the back of the wafer are formed, the wafer needs to be turned back so that the front is upwards, to facilitate the subsequent semiconductor device production process or form a semiconductor device product. Therefore, after the wafer may be turned back so that the front is upwards, the protective film on the surface of the wafer is removed through a chemical or physical grinding method.

Exemplarily, in order to prevent from damaging the semiconductor device when removing the protective film, the protective film may be firstly thinned by using a physical mechanical grinding method, to quickly remove most material of the protective film and keep a partial protective film. Then etching is performed by using a chemical agent with a corrosive effect on the protective film material, so as to remove a residual protective film.

In some embodiments, the operation for determining the deformation position and the deformation degree of the wafer includes the following operation.

Deformation detection is performed on the back of the wafer, to determine the deformation position and the deformation degree.

In embodiments of the present disclosure, whether or not the deformation exists on the wafer, the deformation position and the deformation degree may be firstly determined through the deformation detection. If the deformation exists on the wafer, and the deformation degree is relatively small, for example, the deformation degree is less than a preset adjusting threshold value, it may be considered that the deformation does not exist on the wafer or the deformation adjustment is not needed to be performed. However, if the deformation exists on the wafer and the deformation degree is greater than the preset adjusting threshold value, the deformation adjustment may be further performed through the method in the above embodiments.

The deformation detection method may be implemented through an optical detection method, a probe method or various other methods. An opportunity for performing the deformation detection may be performed in any stage of the semiconductor device manufacturing process. In practical application, the opportunity for performing the deformation detection may be determined according to an influence degree of various production processes on the wafer deformation or the product precision, or detection is performed in a process step (for example, before performing wafer bonding) with a higher requirement on the wafer flatness. After performing the detection, the wafer deformation may be further adjusted through the adjustment method in the above embodiments according to the detection result.

Figure 4:
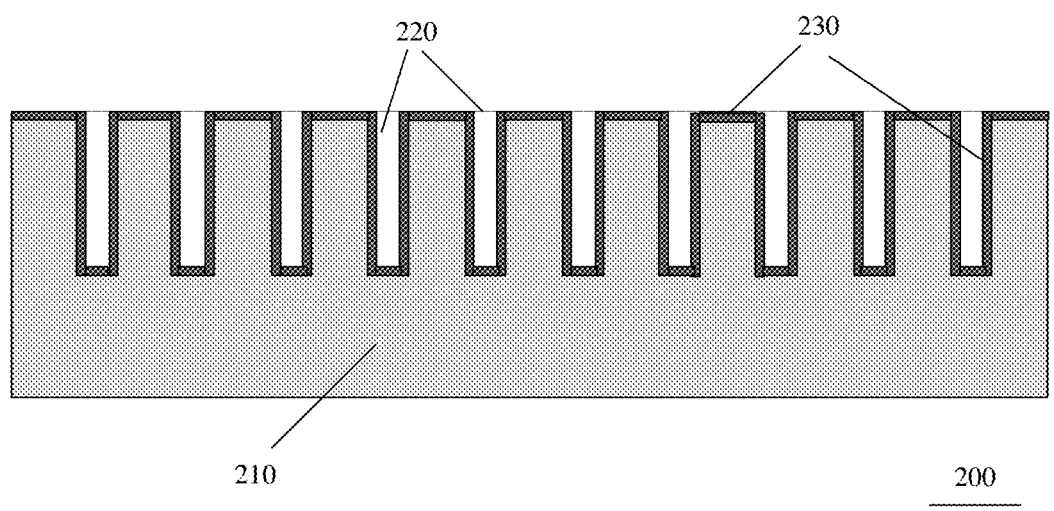
FIG. 4 is a schematic diagram of a semiconductor structure according to embodiments of the present disclosure.

As shown in FIG. 4, embodiments of the present disclosure further provide a semiconductor structure 200. The semiconductor structure 200 includes a wafer 210, at least one groove 220 and a stress film 230.

The groove 220 is provided at the back of the wafer 210.

The back of the wafer with at least one groove 220 includes the stress film 230 having a stress effect on the deformation of the wafer 210. The stress film 230 covers an inner wall of at least one groove 220 and is used to adjust the deformation of the wafer 210.

In a process of manufacturing the semiconductor products, a complicated device and a circuit structure may be formed by performing various means, including photolithography, ion implantation, coating and cleaning on a surface of the wafer. Stress generated during these manufacturing processes may result in wafer deformation, which is also called as wafer warpage. If control is not performed, the wafer deformation may result in a position deviation of a subsequent process, thereby affecting a manufacturing precision and causing a product failure.

Therefore, the semiconductor structure provided by embodiments of the present disclosure includes a groove and a stress film, which may be used to adjust the wafer deformation.

It should be noted that the stress film and the groove at the back of the wafer may provide the stress effect, and the shape, depth and quantity of the groove as well as the film thickness of the stress film, the crystallization degree of the stress film, an annealing temperature at the time of formation and the like will generate different degrees and different directions of stress effect on the wafer, so the complicated wafer deformation may be subjected to accurate adjustment, thereby improving the performance of the semiconductor product and improving the yield.

In some embodiments, different deformation positions at the back of the wafer correspond to adjusting areas respectively.

At least one groove is provided in the scope of each adjusting area.

Different directions and different degrees of deformation may exist at different positions at the back of the above wafer, so the wafer may be divided into different adjusting areas, and the different adjusting areas are adjusted respectively.

Therefore, the groove quantity, shape and depth as well as the thickness of the stress film in different adjusting areas may be different, thereby implementing the accurate adjustment of different adjusting areas.

In some embodiments, the depth of at least one groove is related to the deformation degree of the adjusting area.

The different depths of the groove will generate the effect with different intensities on the wafer stress, so the grooves with different depths may be provided in the different adjusting areas, and the groove depth is formed according to the deformation degree. In addition, the different degrees of deformation adjustment may also be implemented by adopting different annealing temperatures and other means when forming the stress film.

In some embodiments, a semiconductor device is provided at the front of the wafer.

In embodiments of the present disclosure, the front of the wafer is used to form various semiconductor devices, including a memory, a chip and other large-scale integrated circuit structures. The groove and the stress film at the back of the above wafer may be formed after forming the semiconductor device at the front of the wafer, so as to adjust the wafer stress and improve the service life of the device, or may be formed in a process of manufacturing the semiconductor device, for example, some production process of manufacturing the semiconductor device is easy to cause the wafer deformation, so the wafer may be turned after the production process and a structure of the above groove and the stress film may be formed to adjust the deformation, thereby reducing the influence brought by the subsequent production process. Optionally, some production process of manufacturing the semiconductor device has a higher requirement on the wafer flatness, and the abovementioned structure of the groove and the stress film may be formed at the back of the wafer before the production process, thereby improving the wafer flatness and reducing the reject ratio of the production process.

Embodiments of the present disclosure further provide the following examples.

Due to the continuously improved semiconductor manufacturing process, the device size will be smaller and smaller. Therefore, the precision requirement on the production process will be higher. However, the wafer deformation will occur after different production processes, thereby generating an influence on a photolithography precision. Moreover, since the wafer is a single crystal material, which has anisotropy, the deformation in different directions are different, and thus then are difficult to adjust and control.

Figure 5:
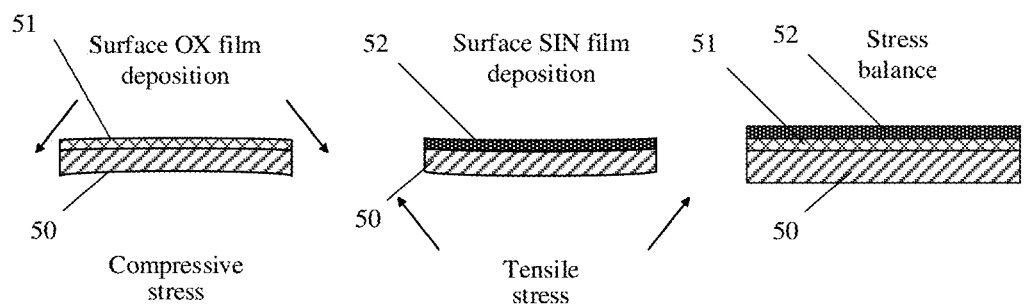
FIG. 5 is a schematic diagram of a stress effect on a wafer when depositing a film on a surface of a wafer according to embodiments of the present disclosure.

In a related art, the stress adjustment may be implemented by adopting a manner of depositing different films on the surface of the wafer. As shown in FIG. 5, the wafer 50 may generate compressive stress by depositing an oxide (OX) film 51, the wafer 50 may generate tensile stress by depositing a silicon nitride (SIN) film 52, and stress balance may be achieved by respectively depositing the OX film and the SIN film.

In embodiments of the present disclosure, in order to implement the accurate control for the wafer deformation and minimize the influence of the wafer deformation on the photolithography precision, film deposition is performed in the groove by adopting the STO or the STO-doped material, and a crystal is formed after the annealing treatment, thereby implementing the adjustment for the wafer deformation in a specific direction. Moreover, this solution may implement the accurate adjustment for a wafer deformation by controlling the groove depth, the annealing temperature and other parameters.

Figure 6:
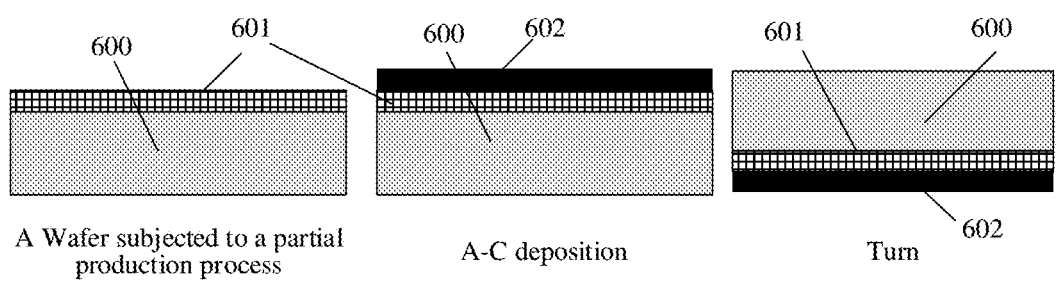
FIG. 6 is a schematic diagram of forming a protective film on a surface of a wafer in a method for adjusting wafer deformation according to embodiments of the present disclosure.

The wafer deformation adjustment method provided by embodiments of the present disclosure may include the following processes. As shown in FIG. 6, the amorphous carbon (A-C) is deposited on the surface of the wafer 600 after subjecting to a partial process to form a partial semiconductor device 601, a protective film 602 is formed, and then wafer is turned so that the back of the wafer is upwards.

Figure 7:
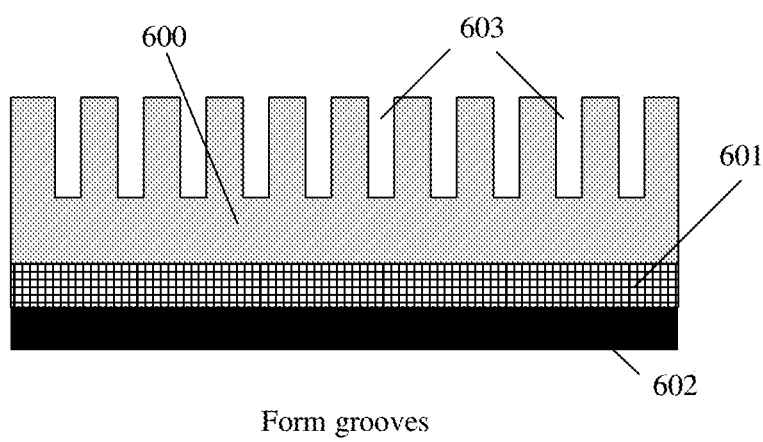
FIG. 7 is a schematic diagram of forming a groove on a back of a wafer in a method for adjusting wafer deformation according to embodiments of the present disclosure.

As shown in FIG. 7, a plurality of grooves 603 are formed at the back of the wafer 600 by etching, the depth, shape and quantity of the formed groove may be adjusted according to the actual demands of the deformation adjustment, or a high-efficiency parameter may be also selected according to the device capacity or a process duration and other demands.

Figure 8:
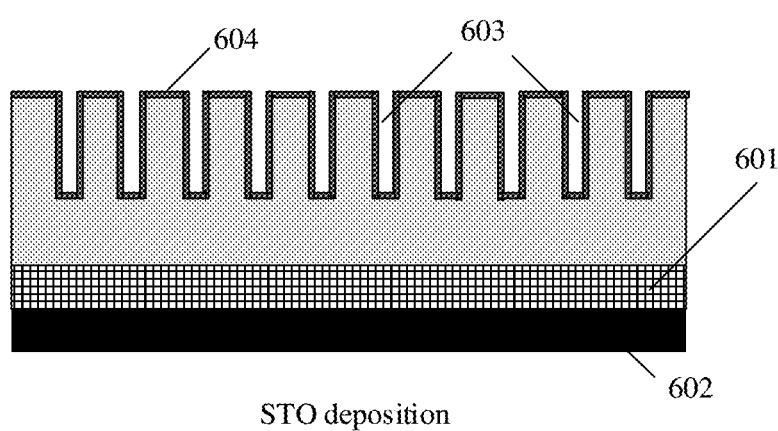
FIG. 8 is a schematic diagram of forming a Strontium Titanium Oxide (STO) film at a back of a wafer in a method for adjusting wafer deformation according to embodiments of the present disclosure.

As shown in FIG. 8, after forming the groove 603, the STO may be deposited at the back of the wafer 600, so that the STO material covers the inner wall of the groove and the surface of the wafer 600, and then a STO film 604 is formed.

Figure 9:
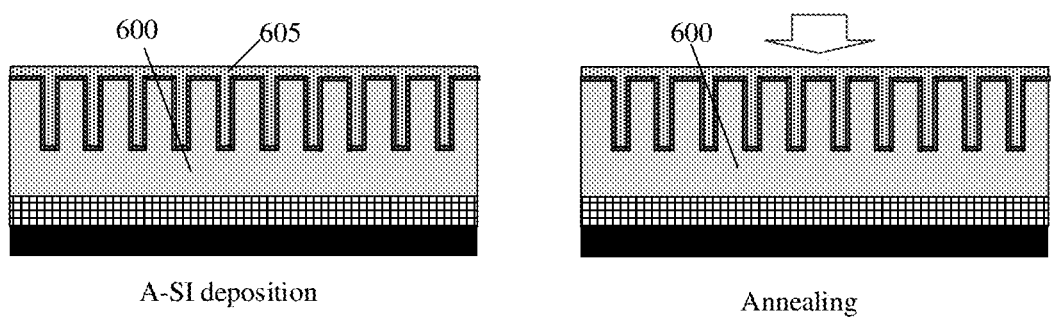
FIG. 9 is a schematic diagram of annealing and forming a stress film at a back of a wafer in a method for adjusting wafer deformation according to embodiments of the present disclosure.

Then, as shown in FIG. 9, an amorphous silicon material (A-Si) 605 may be filled in the groove, so that the A-Si 605 covers the back of the wafer 600. At this time, the annealing treatment may be performed on the back of the wafer 600, for example, Spike Anneal. Then, the STO material may form a crystalline film, and the polycrystalline silicon material is furthered crystallized to form the polycrystalline silicon. The crystallized STO and the polycrystalline silicon are used as the stress film to implement the wafer deformation adjustment.

Figure 10:
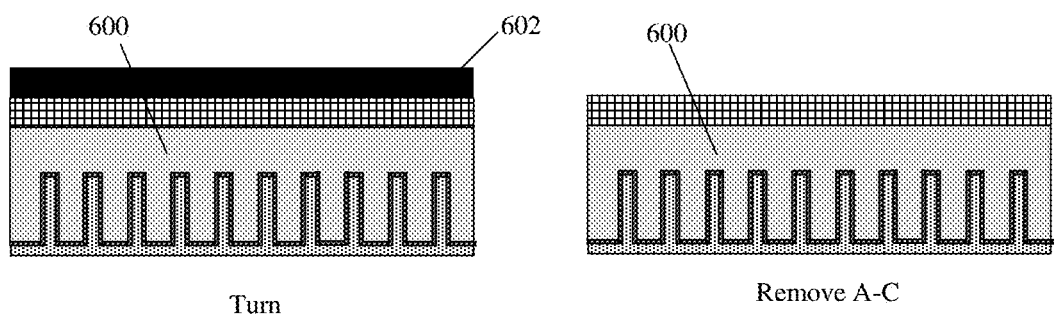
FIG. 10 is a schematic diagram of removing a protective film in a method for adjusting wafer deformation according to embodiments of the present disclosure.

As shown in FIG. 10, after completing the stress film production process, the wafer 600 may be turned, so that the front of the wafer 600 is upwards. An amorphous carbon protective film 602 at the front of the wafer 600 may be removed by grinding, etching and other methods, so that the semiconductor device 601 at the surface of the wafer 600 is exposed again, and a subsequent production process is continuously performed.

Figure 11:
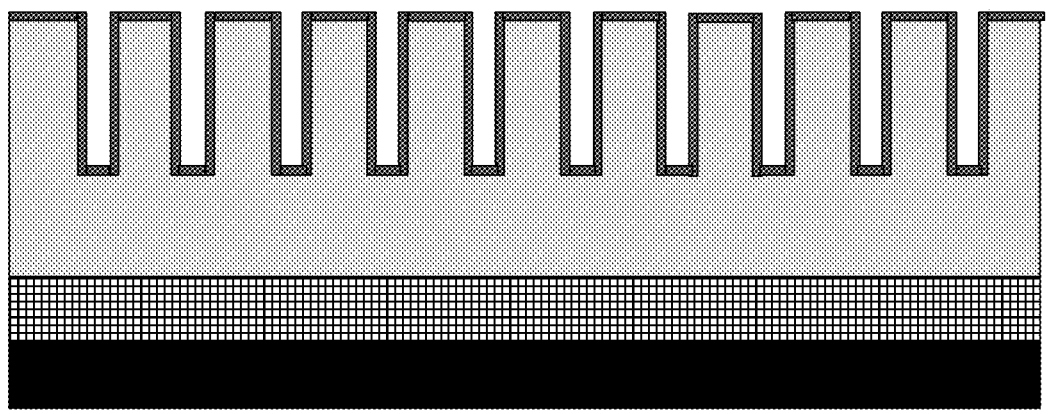
FIG. 11 is a schematic diagram of taking a STO film as a stress film in a method for adjusting wafer deformation according to embodiments of the present disclosure.

As shown in FIG. 11, the STO film at the back of the wafer may implement a wide range of stress adjustment. Exemplarily, the STO film with a thickness of 3 nm (nanometer) may implement the deformation amount adjustment about 100 micrometers, and the deformation amount during the annealing process may be further adjusted through the doping process, the annealing temperature, etc.

It should be understood that terms "one embodiment", "an embodiment" mentioned in the whole specification mean that the specific features, structures, or characteristics related to the embodiment are included in at least one embodiment of the present disclosure. Therefore, terms "in one embodiment" or "in an embodiment" in the whole specification does not necessarily refer to the same embodiment. In addition, these features, structures, or characteristics may be combined in one or more embodiments in any appropriate manner. It should be understood that in the various embodiments of the present disclosure, the size of the serial number of the processes mentioned above does not imply the order of execution, the order of execution of various processes shall be determined by its function and internal logic and shall not constitute any limitation on the implementation of the embodiments of the present disclosure. The serial number of the embodiments of the present disclosure is only for the purpose of description and does not represent the merits of the embodiments.

It should be noted that terms "include" and "contain" or any other variant are intended to cover nonexclusive inclusions herein, so that a process, method, goods or device including a series of elements not only includes those elements but also includes other elements which are not clearly listed or further includes elements intrinsic to the process, the method, the goods or the device. Under the condition of no more limitations, an element defined by the statement "including a/an" does not exclude existence of the same other elements in a process, method, goods or device including the element.

In the embodiments of the present disclosure, it should be understood that the disclosed device and method may be implemented through other manners. The above apparatus embodiments are merely exemplary. For example, the unit division is merely logical function division and there may be other division in actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the devices or units may be implemented in electronic, mechanical, or other forms.

The units described as separate parts may or may not be physically separate, and parts displayed as units may or may not be physical units, may be located in one location, or may be distributed on a plurality of network units, or some or all of the units may be selected according to actual needs to achieve the purpose of the solution of the embodiment.

In addition, functional units in each embodiment of the present disclosure may be integrated into one processing unit, or each unit may have separate physical existence, or two or more units may be integrated in one unit. The abovementioned integrated units may be realized either in the form of hardware or in the form of hardware plus software functional units.

In conclusion, the above is only the implementation mode of the present disclosure, but the scope of protection of the present disclosure is not limited to this. Those skilled in the art can easily think of changes or replacements within the scope of the technology disclosed in the present disclosure, which shall be covered by the scope of protection of the present disclosure. Therefore, the scope of protection of the present disclosure should be subject to the scope of protection of the appended claims.

INDUSTRIAL APPLICABILITY

Embodiments of the present disclosure provide a method for adjusting wafer deformation and a semiconductor structure. The method may be applied to a manufacturing process for a semiconductor product, and the semiconductor structure may be a part or all of the structure in the semiconductor product. In the technical solution provided by embodiments of present disclosure, the groove is formed at the back of the wafer according to the deformation position and the deformation degree of the wafer, and the stress film is covered on the inner wall of the groove, thereby implementing the wafer stress adjustment, improving the wafer deformation, improving the product performance and improving production yield.

The invention claimed is:

1. A method for adjusting wafer deformation, comprising:
   determining a deformation position and a deformation degree of a wafer;
   forming at least one groove at a back of the wafer according to the deformation position and the deformation degree; and
   forming, at the back of the wafer with the at least one groove, a stress film having a stress effect on the wafer deformation, wherein the stress film covers an inner wall of the at least one groove;
   wherein the stress film is a crystalline material, and forming, at the back of the wafer with the at least one groove, the stress film with the stress effect on the wafer deformation comprises:
      depositing a material of the stress film at the back of the wafer with the at least one groove;
      depositing an amorphous silicon film at the back of the wafer, covering the material of the stress film, and filling the at least one groove; and
      performing, according to the deformation degree, an annealing treatment with a corresponding temperature on the back of the wafer, and forming the stress film through crystallizing.

2. The method of claim 1, wherein a plurality of deformation positions are provided at the back of the wafer, and performing, according to the deformation degree, the annealing treatment with a corresponding temperature on the back of the wafer, and forming the stress film through crystallizing comprise:
   performing, according to deformation degrees at different deformation positions of the plurality of deformation positions, annealing treatment with different temperatures on the material of the stress film covered at the different deformation positions respectively, and forming the stress film through crystallizing.

3. The method of claim 1, wherein forming the at least one groove at the back of the wafer according to the deformation position and the deformation degree comprises:
   determining, according to the deformation position, an adjusting area for forming the at least one groove at the back of the wafer; and
   forming, according to the deformation degree, the at least one groove, each of the at least one groove having a respective depth, in the adjusting area.

4. The method of claim 3, wherein forming, according to the deformation degree, the at least one groove, each of the at least one groove having the respective depth, in the adjusting area comprises:
   forming, according to the deformation degree, the at least one groove, each of the at least one groove having the respective depth, in the adjusting area, by etching.

5. The method of claim 4, wherein forming, according to the deformation degree, the at least one groove, each of the at least one groove having the respective depth, in the adjusting area comprises:
   forming a mask layer with an etching pattern on a surface of the adjusting area;
   forming, according to the deformation degree, the at least one groove, each of the at least one groove having the respective depth, in the adjusting area by etching a position unmasked by the mask layer; and
   removing the mask layer.

6. The method of claim 1, wherein a semiconductor device is formed at a front of the wafer and in a first thickness from the front of the wafer to an interior of the wafer, and a depth of the at least one groove is less than a difference between a thickness of the wafer and the first thickness.

7. The method of claim 1, wherein the at least one groove comprises at least two grooves with different shapes, depths or widths.

8. The method of claim 1, wherein before forming the at least one groove at the back of the wafer, the method further comprises:
   forming a protective film on a surface of a semiconductor device at a front of the wafer; and
   turning the wafer to make an orientation of the back of the wafer vertically upward.

9. The method of claim 8, wherein after forming the stress film at the back of the wafer, the method further comprises:
   turning the wafer to make the orientation of the front of the wafer vertically upward; and
   removing the protective film at the front of the wafer.

10. The method of claim 1, wherein determining the deformation position and the deformation degree of the wafer comprises:
    performing deformation detection on the back of the wafer, and determining the deformation position and the deformation degree.

11. The method of claim 1, wherein a thermal expansion coefficient of the crystalline material is less than a thermal expansion coefficient of the wafer.

12. The method of claim 11, wherein the material of the stress film is Strontium Titanium Oxide (STO), or a STO-doped material.

13. The method of claim 1, wherein the amorphous silicon film is crystallized to form a polycrystalline silicon film through the annealing treatment.

14. A semiconductor structure, comprising:
    a wafer;
    at least one groove at a back of the wafer;
    a crystallized stress film having a stress effect on wafer deformation, which is comprised at the back of the wafer with the at least one groove, wherein the crystallized stress film covers an inner wall of the at least one groove and is used for adjusting the wafer deformation; and a polycrystalline silicon film, covering the crystallized stress film, and filling the at least one groove.

15. The semiconductor structure of claim 14, wherein different deformation positions at the back of the wafer respectively correspond to adjusting areas; and wherein at least one groove of the at least one groove is provided in a scope of each of the adjusting areas.

16. The semiconductor structure of claim 15, wherein a depth of the at least one groove is related to a deformation degree of a corresponding one of the adjusting areas.

17. The semiconductor structure of claim 14, wherein a front of the wafer is provided with a semiconductor device.

* * * * *